Aug. 2, 1966 H. D. BRYANT 3,264,576

CIRCUIT FOR CONVERTING ANY FREQUENCY IN A GIVEN RANGE TO A HARMONIC EQUAL TO A DESIRED FREQUENCY

Filed March 23, 1964 2 Sheets-Sheet 1

INVENTOR.
Harold D. Bryant
BY
Mueller & Aichele
Attys.

Aug. 2, 1966 H. D. BRYANT 3,264,576

CIRCUIT FOR CONVERTING ANY FREQUENCY IN A GIVEN RANGE TO A HARMONIC EQUAL TO A DESIRED FREQUENCY

Filed March 23, 1964 2 Sheets-Sheet 2

INVENTOR.
Harold D. Bryant
BY
Mueller & Aichele
Attys.

United States Patent Office 3,264,576

Patented August 2, 1966

3,264,576

CIRCUIT FOR CONVERTING ANY FREQUENCY IN A GIVEN RANGE TO A HARMONIC EQUAL TO A DESIRED FREQUENCY

Harold D. Bryant, Glendale Heights, Glen Ellyn, Ill., assignor to Motorola, Inc., Franklin Park, Ill., a corporation of Illinois Filed Mar. 23, 1964, Ser. No. 353,739
7 Claims. (Cl. 331—47)

This invention relates to a frequency converter circuit, and in particular to a frequency converter circuit which accepts an input signal having any one of a particular plurality of frequencies and develops an output signal having a frequency equal to a harmonic of the input signal frequency and substantially equal to a predetermined frequency.

In order to simplify the design and use of test instruments it is desirable that the frequency of the input signal applied to the test instrument be a single predetermined frequency. For example, in a Frequency Error Expander, which multiplies the frequency difference between an input test signal and a reference signal by a given amount in order to facilitate accurate frequency comparisons, it is necessary to use an input test signal having a frequency of one megacycle. In order to extend the frequency range over which the Frequency Error Expander will operate, a frequency converter can be used which will accept input signals having any one of a particular group of frequencies above and below one megacycle and having an output signal with a frequency substantially equal to one megacycle. The one megacycle output signal should have the same percentage frequency error as the particular input signal and no output signal should be developed in the absence of an input signal.

It is therefore an object of this invention to provide a frequency converter which accepts an input signal having any one of a particular group of frequencies and which develops an output signal having a frequency equal to a harmonic of the input signal frequency and substantially equal to a predetermined frequency.

Another object of this invention is to provide a frequency converter in accordance with the preceding object wherein the development of an output signal is prevented in the absence of an input signal.

A feature of this invention is the provision of a frequency converter with a plurality of oscillators having output frequencies harmonically related and coupled in a sequence, with each oscillator coupled to the oscillator closest to it in frequency, and with one of said oscillators having an output frequency substantially equal to a predetermined frequency.

Another feature of this invention is the provision of a frequency converter with frequency responsive routing circuit means coupling the input signal to the oscillator having the lowest harmonic ratio between its output frequency and the frequency of the input signal.

Another feature of this invention is the provision of a frequency converter with harmonic generation means coupled to the first oscillator in the sequence of oscillators for receiving the input signal and generating harmonics thereof.

In practicing this invention a plurality of oscillators having different harmonically related output frequencies are coupled in sequence, with the output of a lower frequency oscillator coupled to input of a higher frequency oscillator. An input circuit is provided for receiving and amplifying input signals applied thereto. A switch is provided coupling the oscillators to the power supply, when an input signal is received. A frequency responsive routing circuit couples the input circuit to all of the oscillators and provides a path whereby the input signal is coupled to the oscillator having the lowest harmonic ratio between its output frequency and the frequency of the input signal. Provided the harmonic ratio is not too high, the input signal will act to synchronize one of the oscillators at a frequency substantially equal to the output frequency of the oscillator and having an exact harmonic relationship to the input frequency. If one of the oscillators synchronizes with the input signal, the output frequency generated by the synchronized oscillator will cause the other oscillator or oscillators in the sequence to synchronize with a harmonic of the input signal. Thus an output signal is developed substantially equal to a predetermned frequency and having an exact harmonic relationship with the input signal.

The frequency range of input signals which are capable of synchronizing the oscillators can be extended to lower frequencies by including harmonic generating means in the input circuit and using the harmonics thus generated to synchronize the oscillators. The frequency range can be increased upward by adding additional oscillators to the sequence with the output frequency of the added oscillators having a harmonic relationship with the oscillators of the sequence. A frequency responsive routing means couples the input circuit to each oscillator.

Figures 1, 2:
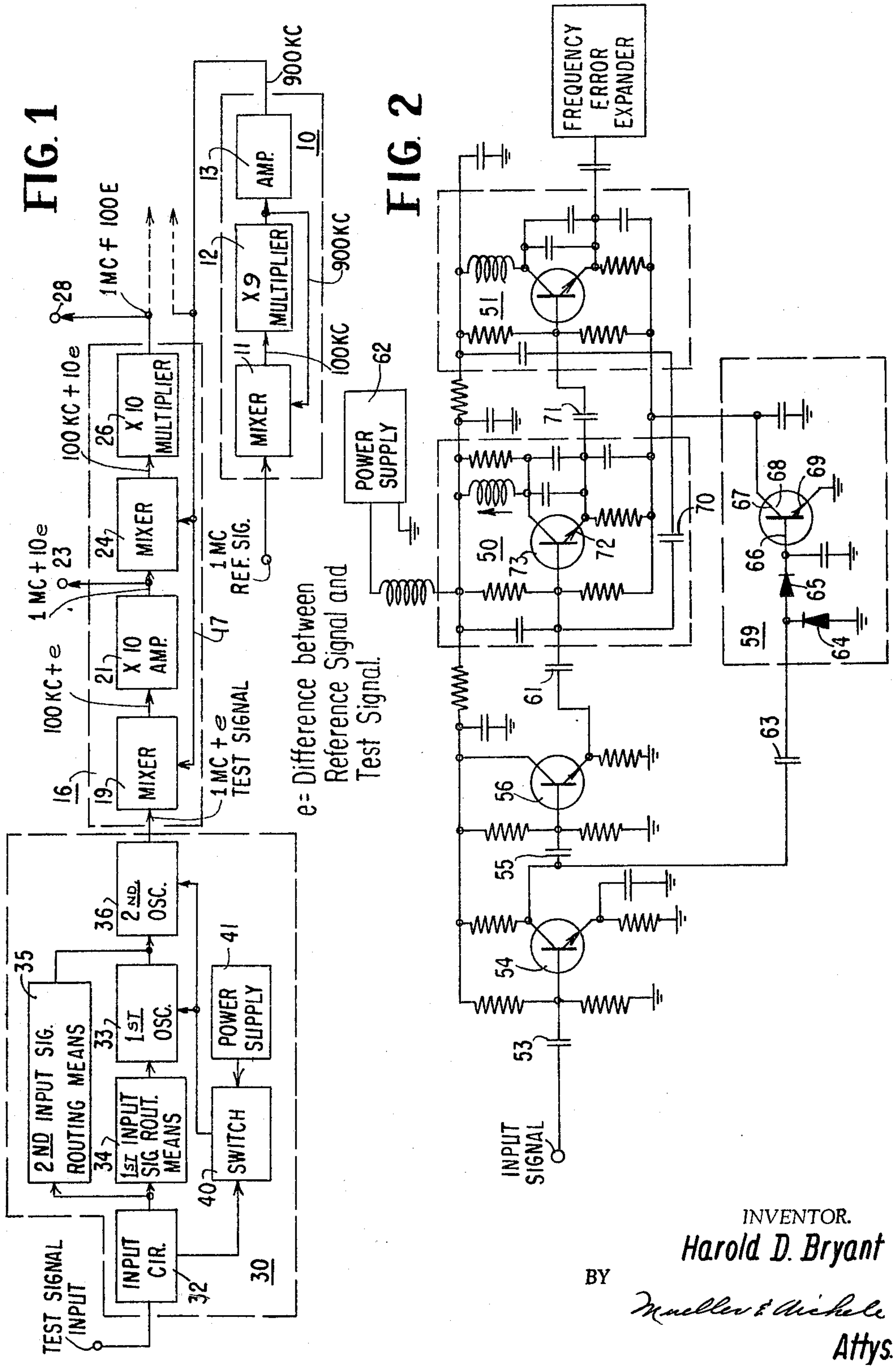
FIG. 1 is a block diagram illustrating the operation of the frequency converter and a Frequency Error Expander.
FIG. 2 is a partial schematic and partial block diagram of the frequency converter.

A block diagram of a frequency converter incorporating the features of this invention and a Frequency Error Expander manufactured by Motorola, Inc., assignee of this application, is illustrated in FIG. 1. A regenerative frequency divider 10 develops a 900 kc. signal from a 1 mc. reference signal input. The 1 mc. reference signal is mixed with a 900 kc. signal in mixer 11 and the lower sideband 100 kc., is coupled from mixer 11 to X9 multiplier 12. The output of the X9 multiplier 12 is a 900 kc. signal which is coupled back to mixer 11. The output of X9 multiplier 12 is also coupled to amplifier 13 and the 900 kc. output of amplifier 13 is coupled to 900 kc. bus 17 in the error expander portion 16 of the Frequency Error Expander.

The input signal to the error expander 16, which is to be tested has a frequency of 1 mc.$+e$, where $e$ represents the difference between one megacycle and the input signal frequency. The 1 mc.$+e$ test signal is mixed with the 900 kc. signal in mixer 19 and the lower sideband of the resulting output signal has a frequency of 100 kc.$+e$. The 100 kc.$+e$ signal is multiplied in X10 multiplier 21 to generate an output signal having a frequency of 1 mc.$+10e$. This signal is coupled to output terminal 23 and also to mixer 24 where it is mixed with the 900 kc. signal. The lower sideband of the output signal from mixer 24 has a frequency of 100 kc.$+10e$. This signal is multiplied in X10 multiplier 26 to develop a signal having a frequency of 1 mc.$+100e$, which is coupled to terminal 28 and to subsequent mixer and multiplier stages as desired. Thus the Frequency Error Expander produces output signals having the same fundamental frequency as the reference signal, 1 mc., plus an expanded error frequency.

The input signal to the Frequency Error Expander shown in FIG. 1 is 1 mc. Since a signal at a frequency of 1 mc. is not always available from equipment under test, frequency converter 30 is provided to convert the frequency available from the equipment to be tested to a 1 mc. signal, preserving the proportional error contained in the original test signal. The test signal from the equipment under test is coupled to input circuit 32. The output of the input circuit is coupled to first oscillator 33 by input signal routing circuit 34 and to second oscillator 36 by input signal routing circuit 35. The output of oscillator 33 is coupled to second oscillator 36. First and second oscillators 33 and 36 have output frequencies which are harmonically related and which can be synchronized by harmonics of the input signal which are close to their output frequencies. The error frequency in the output signal from oscillator 36 is proportionally the same as the frequency error in the input signal. Thus if the input test signal is at a frequency of 100 kc. with an error of 10 cycles, the output of second oscillator 36 would be 1 mc. plus 100 cycles.

In an example of the operation of the frequency converter assume a test signal of 100 kc.$+e$ is received by input circuit 32 and that first oscillator 33 is tuned to 500 kc. and second oscillator 36 is tuned to the desired output frequency 1 mc. The harmonic ratio of the input signal frequency to the output frequency of the first oscillator is 5 to 1 and to the output frequency of the second oscillator is 10 to 1. The input signal routing circuits 34 and 35 are responsive to the frequency of the input signal to couple the input signal to first oscillator 33 which has the smallest harmonic ratio. The 100 kc.$+e$ input frequency will cause first oscillator 33 to synchronize at an exact harmonic of the input frequency closest to the nominal tuned frequency of first oscillator 33. If the harmonics of the input frequency are too far from the nominal frequency of the oscillator or if the harmonic ratio is too large the oscillators will not synchronize. Thus the 1 mc. oscillator 36 having a 10 to 1 harmonic ratio would not synchronize reliably with the input signal of 100 kc.$+e$ while the 500 kc. oscillator 33 having a harmonic ratio of 5 to 1 will synchronize. The output frequency of oscillator 33 will be the fifth harmonic of the input frequency or 500 kc. $+5e$. The harmonic ratio between this signal and the output of oscillator 36 is 2 to 1 so that this signal will synchronize oscillator 36. The output frequency of oscillator 36 will be 1 mc.$+10e$, a frequency which preserves the proportional error of the original signal and provides an input signal for the Frequency Error Expander.

For test signals having higher frequencies, for example 3 mc.$+e$, the harmonic ratio between the input signal frequency and the frequency oscillator 33 would be too high to cause oscillator 33 to synchronize at a harmonic of the input frequency. However, the 3 mc.$+e$ signal would be applied to oscillator 36 through second input signal routing circuit 35 and would synchronize oscillator 36 at 1 mc. $+e/3$. The 1 mc.$+e/3$ signal from second oscillator 36 will be coupled back to first oscillator 33 and will synchronize this oscillator at 500 kc.$+e/6$. By combining two oscillators in sequence wherein the second oscillator is a different frequency than the first oscillator and coupling the input signal to each oscillator by a frequency responsive input signal routing circuit, the frequency range over which the two oscillators can by synchronized is greatly extended. Thus the frequency converter 30 can be synchronized over a wide range of input frequencies having a harmonic relationship with the output frequency. While in the example given the second oscillator has a higher frequency than the first oscillator this is not necessary and the first oscillator could have the higher frequency.

Since first oscillator 33 and second oscillator 36 are normally free running oscillators, unless synchronized by an input signal, they will generate an output signal even if no input signal is present. A switch 40 is provided coupling power supply 41 to first and second oscillators 33 and 36. Switch 40 normally disconnects power supply 41 from oscillators 33 and 36. However, when an input signal is present in input circuit 32 a portion of this signal is coupled to switch 40 causing it to connect power supply 41 to the oscillators 33 and 36. Thus oscillators 33 and 36 only operate when an input signal is present to synchronize the oscillators to the desired output frequency. The operation of circuit 40 is explained in application of Friedricks et al., Serial No. 313,474 filed October 3, 1963, now Patent No. 3,217,270 and assigned to the assignee of this application.

The schematic diagram of a circuit incorporating the features of this invention is shown in FIG. 2. Oscillators 50 and 51 are standard Colpitts type oscillators, but can be any oscillators responsive to a synchonizing signal so that the oscillator is synchronized at an output frequency which is an exact harmonic of the synchronizing frequency. Oscillator 51 oscillates at the desired output frequency and at a higher frequency than oscillator 50. The frequencies to which oscillators 50 and 51 are tuned are harmonically related. The input signal is coupled to transistor amplifier 54 through capacitor 53 and is amplified and applied to an emitter follower 56 through capacitor 55. Transistor amplifier 54 amplifies incoming signals to increase their amplitude to a level where the output from the amplifier can drive emitter follower 56 and the switch circuit 59. The output signal from emitter follower transistor 56 is coupled to first oscillator 50 through coupling capacitor 61. Emitter follower 56 provides a signal strong enough to synchronize oscillator 50 at a harmonic frequency of the input signal.

Switch 59 is coupled to transistor amplifier 54 through capacitor 63. When an input signal is present the amplified signal is detected by diodes 64 and 65 and applied to base 66 of transistor 67 to bias transistor 67 to full conduction. Oscillators 50 and 51 are connected to the ground terminal of power supply 62 through collector 68 and emitter 69 of transistor 67. When no input signal is present, the bias on base 66 of transistor 67 is such that transistor 67 is biased to cut off and no current flows to oscillators 50 and 51. Thus oscillators 50 and 51 are rendered inoperative when no input signal is present.

The input signal of oscillator 50 is coupled to oscillator 51 by capacitor 70. The impedance of capacitor 70 is frequency dependant so that higher frequency signals are coupled more strongly to oscillator 51 than lower frequency signals. Thus when the input signals are too high in frequency to synchronize oscillator 50, the signal is coupled to oscillator 51 to synchronize that oscillator. The signal developed by oscillator 51 is coupled back to emitter 72 of transistor 73 through capacitor 71 causing oscillator 50 to synchronize with oscillator 51. Thus input signals which are too high in frequency to synchronize oscillator 50 at a harmonic frequency of the input signal will bypass oscillator 50 through capacitor 70 and synchronize oscillator 51. The signal developed by oscillator 51 will in turn synchronize oscillator 50 causing both oscillators 50 and 51 to be synchronized with the incoming signal with oscillator 51 having an output frequency substantially equal to the desired output frequency.

Figures 3, 4:
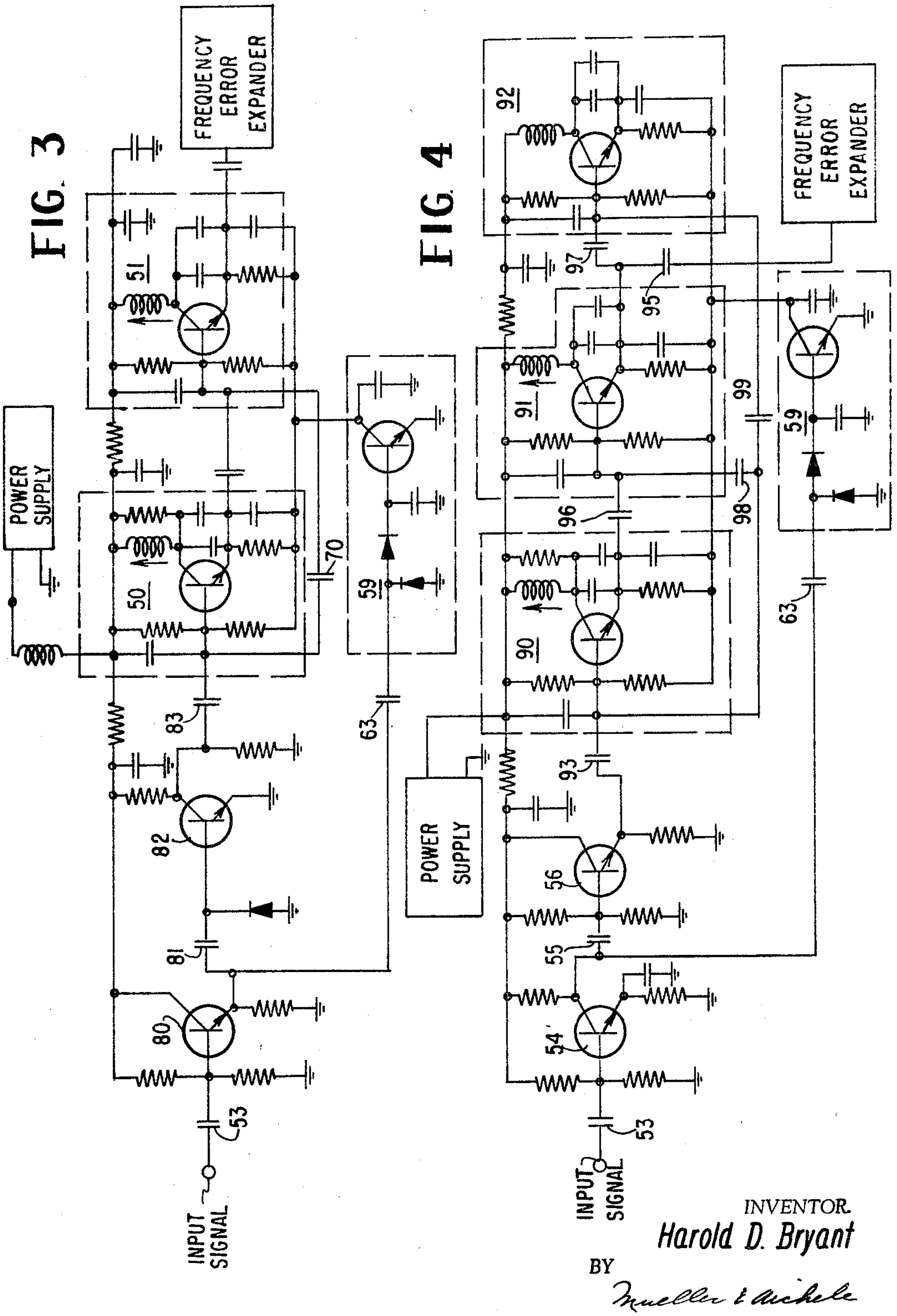
FIG. 3 is a partial schematic and partial block diagram of an embodiment of the frequency converter incorporating means for generating harmonics of the input signals.
FIG. 4 is a partial schematic and partial block diagram of an embodiment of the frequency converter having an additional oscillator.

FIG. 3 illustrates another embodiment of this invention in which the frequency range of input signals which will synchronize oscillators 50 and 51 has been extended downward. The input signal is coupled to emitter follower 80 through capacitor 53. The output of emitter follower 80 is coupled through capacitor 81 to square wave generator 82. The output of square wave generator 82 is coupled to oscillator 50 through capacitor 83 to synchronize oscillator 50 at a harmonic frequency of the input signal. The output of emitter follower 80 is also coupled to switch 59 to operate switch 59 as previously described. The output of square wave generator 82 is a signal containing harmonics of the input frequency thus reducing the harmonic ratio between the input signal and the frequency of oscillator 50. The harmonics of the input signal will synchronize oscillator 50 even though the frequency of the input signal is too low to synchronize oscillator 50. Oscillator 51 synchronizes with oscillator 50 as previously described to develop the desired output signal frequency.

FIG. 4 illustrates an embodiment of the invention in which the frequency range of input signals which will synchronize the oscillators has been extended upward by the addition of an oscillator. Oscillator 91 is reasonant at the desired output frequency and its output is coupled to the Frequency Error Expander through capacitor 95. The input of oscillator 91 is coupled to the output of oscillator 90 through capacitor 96 and the output of oscillator 91 is coupled to the input of oscillator 92 through capacitor 97. The frequencies to which oscillators 90, 91 and 92 are tuned have a harmonic relationship with each other, with oscillator 90 having a nominal resonant frequency lower than oscillator 91 and oscillator 92 having a nominal resonant frequency higher than oscillator 91. The input circuit to oscillator 90 is coupled to the input circuit of oscillator 91 through capacitor 98 and to the input circuit of oscillator 92 through capacitor 99. The action of amplifier transistor 54, emitter follower transistor 56 and switch 59 are as previously described.

An input signal coupled to the input circuit of oscillator 90 through capacitor 93 is used to synchronize oscillator 90 at an exact harmonic frequency of the input frequency. However, if the input frequency becomes too high, oscillator 90 will not synchronize with the input frequency. At the frequency at which this occurs, the impedance of bypass capacitor 98 is reduced to a value sufficiently low to couple a strong signal directly to the input circuit of oscillator 91. Thus the input signal will now synchronize oscillator 91 at a frequency equal to an exact harmonic of the frequency of the input signal. The output signal from oscillator 91 is coupled back to oscillator 90 through capacitor 96 and will synchronize oscillator 90 at a lower frequency which is an exact harmonic frequency of the input signal frequency. When the frequency of the input signal becomes higher it will be unable to synchronize oscillator 91. When this occurs, the impedance of bypass capacitor 99 is reduced to a value sufficiently low to couple a strong input signal directly to the input circuit of oscillator 92, causing this oscillator to be synchronized at a harmonic frequency of the input signal. The output signal of oscillator 92 is coupled back to oscillator 91 through capacitor 97 and the output signal from oscillator 91 is coupled back to oscillator 90 through capacitor 96. Oscillators 90 and 91 are synchronized at an exact harmonic frequency of the input signal. The output frequency of oscillator 91, which is the desired output frequency, is coupled through capacitor 95 to the Frequency Error Expander.

Assume, for example, that the oscillators 90, 91 and 92 will synchronize with a frequency having a harmonic relationship with nominal frequency of the oscillator of 5 to 1, and that oscillator 90 is resonant at 500 kc., oscillator 91 at 1 mc. and oscillator 92 at 5 mc. With the oscillators of the frequency converter resonant at these frequencies a range of input frequencies of from 100 kc. to 25 mc. can be used to synchronize oscillator 91 at a frequency substantially equal to 1 mc. and at an exact harmonic of the input frequency. The circuit described is not limited to two or three oscillators coupled in sequence but the number of oscillators can be extended as desired.

While examples of circuits have been shown in which the oscillators are coupled in a sequence in which each oscillator has a higher frequency than the oscillator which precedes it the invention is not limited to this configuration. The oscillator can also be coupled in a sequence in which each oscillator has a lower frequency than the oscillator that precedes it. If this is done the frequency responsive routing means will be inductors instead of capacitors as shown in the example.

Thus a simple frequency converter has been disclosed which will produce an output signal having a frequency substantially equal to a desired output frequency and which is an exact harmonic of the frequency of an input signal so that any errors present in the input signal are present in the same proportion in the output signal.

I claim:

1. A circuit for developing an output signal having a frequency substantially equal to a predetermined frequency and equal to a harmonic frequency of an input signal having any one of a particular plurality of frequencies, said circuit including in combination, input circuit means, a plurality of oscillators each having a different output frequency with said output frequencies having harmonic relationships, one of said oscillators having an output frequency substantially equal to the predetermined frequency, means coupling said oscillators in a sequence with each oscillator coupled to the oscillator having an output frequency closest to its own output frequency, input signal routing means coupling said input circuit means to each of said oscillators, said routing means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency, and each synchronized oscillator synchronizing the adjacent oscillator whereby all of said oscillators are synchronized at an exact harmonic frequency of the input frequency.

2. A circuit for developing an output signal having a frequency substantially equal to a predetermined frequency and equal to a harmonic frequency of an input signal having any one of a particular plurality of frequencies, said circuit including in combination, a plurality of oscillators each operative at a different output frequency with said output frequencies having harmonic relationships, one of said oscillators having an output frequency substantially equal to the predetermined frequency, means coupling said oscillators in a sequence with each oscillator coupled to the oscillator having an output frequency closest to its own output frequency, input circuit means for receiving and amplifying the input signal, power supply means, switch means coupled to said input circuit means and coupling said power supply means to said plurality of oscillators, said switch means being responsive to the input signal to couple said plurality of oscillator means to said power supply, input signal routing means coupling said input circuit means to each of said oscillators, said routing means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency, and each synchronized oscillator synchronizing the adjacent oscillator whereby all of said oscillators are synchronized at an exact harmonic frequency of the input frequency.

3. A circuit for developing an output signal having a frequency substantially equal to a predetermined frequency and equal to a harmonic frequency of an input signal having any one of a particular plurality of frequencies, said circuit including in combination, a plurality of oscillators each operative at a different output frequency with said output frequencies having harmonic relationships, one of said oscillators having an output frequency substantially equal to the predetermined frequency, means coupling said oscillators in a sequence with each oscillator in the sequence having an output frequency higher in frequency than the oscillator which preceded it, input circuit means for receiving and amplifying the input signal, input signal routing means coupling said input circuit means to each of said oscillators, said routing means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency and each synchronized oscillator synchronizing the adjacent oscillator whereby all of said oscillators are synchronized at an exact harmonic frequency of the input frequency.

4. A circuit for developing an output signal having a frequency substantially equal to a predetermined frequency and equal to a harmonic frequency of an input signal having any one of a particular plurality of frequencies, said circuit including in combination, first and second oscillators each having input and output means and operative at a different output frequency with said output frequencies having harmonic relationships, said input means of said second oscillator being coupled to said output means of said first oscillator, said second oscillator having an output frequency substantially equal to the predetermined frequency and higher in frequency than the output frequency of said first oscillator, input circuit means including first amplifier means for receiving and amplifying the input signal and second amplifier means coupling said first amplifier means to said input means of said first oscillator, power supply means, switch means coupled to said first amplifier means and coupling said power supply means to said first and second oscillators, said switch means being responsive to the input signal to couple said first and second oscillators to said power supply, capacitor means coupling said input means of said first oscillator to said input means of said second oscillator, said capacitor means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency whereby all of said oscillators are synchronized at an exact harmonic frequency of the input frequency.

5. A circuit for developing an output signal having a frequency substantially equal to a predetermined frequency and equal to a harmonic frequency of an input signal having any one of a particular plurality of frequencies, said circuit including in combination, first and second oscillators each having input and output means and operative at a different output frequency with said output frequencies having harmonic relationships, said input means of said second oscillator being coupled to said output means of said first oscillator, said second oscillator having an output frequency substantially equal to the predetermined frequency and higher in frequency than the output frequency of said first oscillator, input circuit means including first amplifier means for receiving and amplifying the input signal and second amplifier means coupling said first amplifier means to said input means of said first oscillator, capacitor means coupling said input means of said first oscillator to said input means of said second oscillator, said capacitor means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency whereby all of said oscillators are synchronized at an exact harmonic frequency of the input frequency.

6. A circuit for developing an output signal having a frequency substantially equal to a predetermined frequency and equal to a harmonic frequency of an input signal having any one of a particular plurality of frequencies, said circuit including in combination, first and second oscillators each having input and output means and operative at a different output frequency with said output frequencies having harmonic relationships, said input means of said second oscillator being coupled to said output means of said first oscillator, said second oscillator having an output frequency substantially equal to the predetermined frequency and higher in frequency than the output frequency of said first oscillator, input circuit means including amplifier means for receiving and amplifying the input signal and square wave generating means for developing harmonic frequencies of the input signal frequency coupling said amplifier means to said input means of said first oscillator, capacitor means coupling said input means of said first oscillator to said input means of said second oscillator, said capacitor means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency whereby all of said oscillators are synchronized at an exact harmonic frequency of the input frequency.

7. A circuit for developing an output signal having a frequency substantially equal to a predetermined frequency and equal to a harmonic frequency of an input signal having any one of a particular plurality of frequencies, said circuit including in combination, first, second and third oscillators each having input and output means and operative at a different output frequency with said output frequencies having harmonic relationships, said input means of said third oscillator being coupled to said output means of said second oscillator and said input means of said second oscillator being coupled to said output means of said first oscillator, said third oscillator having an output frequency higher in frequency than the output frequency of said second oscillator and said second oscillator having an output frequency substantially equal to the predetermined frequency and higher in frequency than the output frequency of said first oscillator, input circuit means including first amplifier means for receiving and amplifying the input signal and second amplifier means coupling said first amplifier means to said input means of said first oscillator, first capacitor means coupling said input means of said first oscillator to said input means of said second oscillator and second capacitor means coupling said input means of said first oscillator to said input means of said third oscillator, said first and second capacitor means being responsive to the frequency of the input signal to couple the input signal to the oscillator having the lowest harmonic ratio between its output frequency and the frequency of the input signal, said oscillator to which the input signal is routed being responsive to the input signal frequency to synchronize its output frequency at an exact harmonic frequency of the input frequency whereby all of said oscillators are synchronized at an exact harmonic frequency of the input frequency.

No references cited.

ROY LAKE, *Primary Examiner.*

S. H. GRIMM, *Assistant Examiner.*